United States Patent
Chen et al.

(10) Patent No.: US 10,163,803 B1
(45) Date of Patent: Dec. 25, 2018

(54) INTEGRATED FAN-OUT PACKAGES AND METHODS OF FORMING THE SAME

(71) Applicant: Taiwan Semiconductor Manufacturing Co., Ltd., Hsinchu (TW)

(72) Inventors: Wei-Yu Chen, New Taipei (TW);
An-Jhih Su, Taoyuan (TW);
Der-Chyang Yeh, Hsin-Chu (TW);
Li-Hsien Huang, Hsinchu County (TW); Ming-Shih Yeh, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/627,449

(22) Filed: Jun. 20, 2017

(51) Int. Cl.
| | | |
|---|---|---|
| *H01L 21/48* | (2006.01) | |
| *H01L 23/31* | (2006.01) | |
| *H01L 25/10* | (2006.01) | |
| *H01L 23/538* | (2006.01) | |
| *H01L 21/56* | (2006.01) | |
| *H01L 25/00* | (2006.01) | |

(52) U.S. Cl.
CPC ........ *H01L 23/5389* (2013.01); *H01L 21/486* (2013.01); *H01L 21/4853* (2013.01); *H01L 21/4857* (2013.01); *H01L 21/4864* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 25/105* (2013.01); *H01L 25/50* (2013.01); *H01L 2225/1035* (2013.01); *H01L 2225/1058* (2013.01)

(58) Field of Classification Search
CPC ....... H01L 25/10; H01L 25/50; H01L 25/105; H01L 23/53; H01L 23/538; H01L 23/5383; H01L 23/5384; H01L 23/5386; H01L 21/48; H01L 21/485; H01L 21/486; H01L 21/4853; H01L 21/4857; H01L 21/4864; H01L 21/56; H01L 21/565
USPC ......................................................... 257/668
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Monica D Harrison
(74) *Attorney, Agent, or Firm* — JCIPRNET

(57) ABSTRACT

Integrated fan-out packages and methods of forming the same are disclosed. An integrated fan-out package includes a first die, at least one through integrated fan-out via and a molding layer. The at least one through integrated fan-out via is aside the first die and includes a seed layer and a metal layer. The molding layer encapsulates the at least one through integrated fan-out via and the first die. Besides, the seed layer surrounds a sidewall of the metal layer and is between the metal layer and the molding layer.

20 Claims, 10 Drawing Sheets

(56) References Cited

U.S. PATENT DOCUMENTS

2016/0035663 A1* 2/2016 Huang ................ H01L 23/3114
                                                    257/668
2017/0186678 A1* 6/2017 Lin .................... H01L 23/49827

* cited by examiner

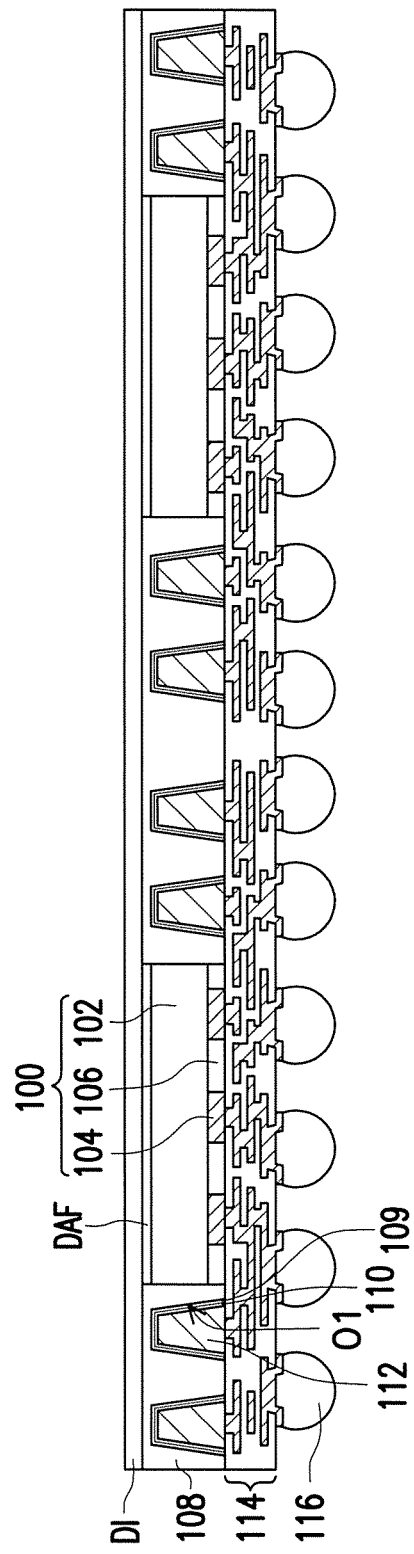
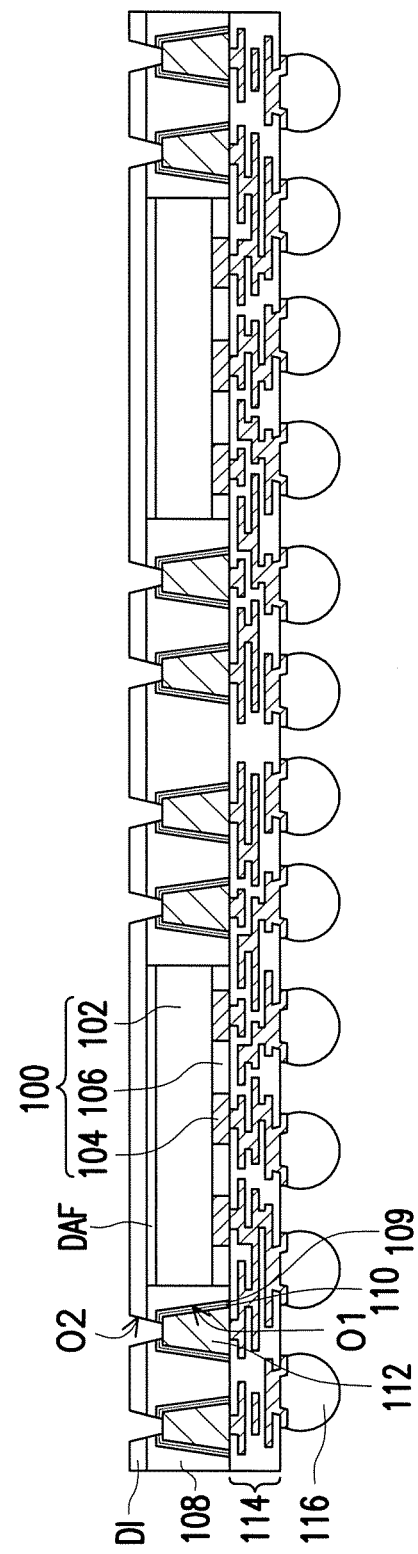
FIG. 1G
FIG. 1H

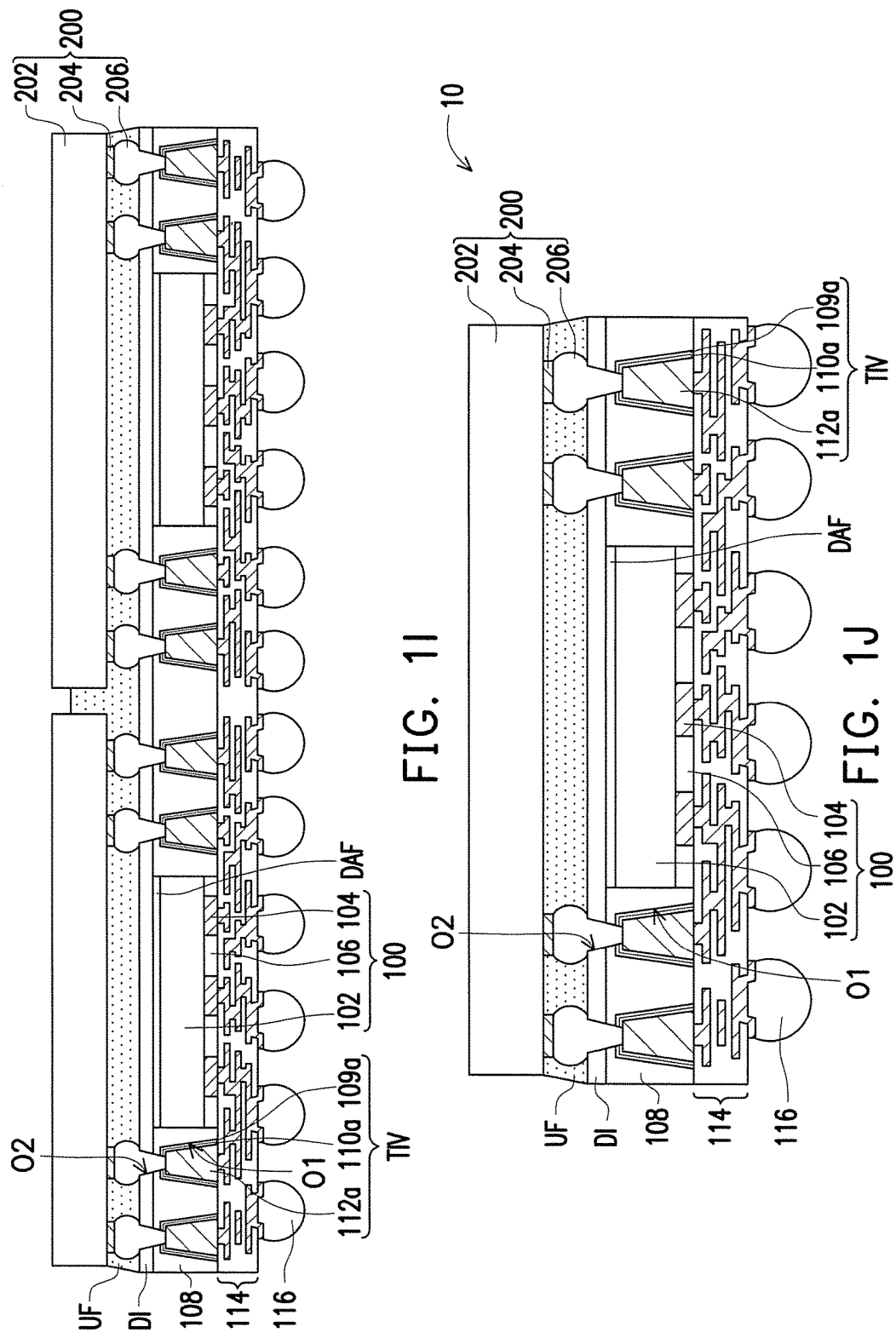

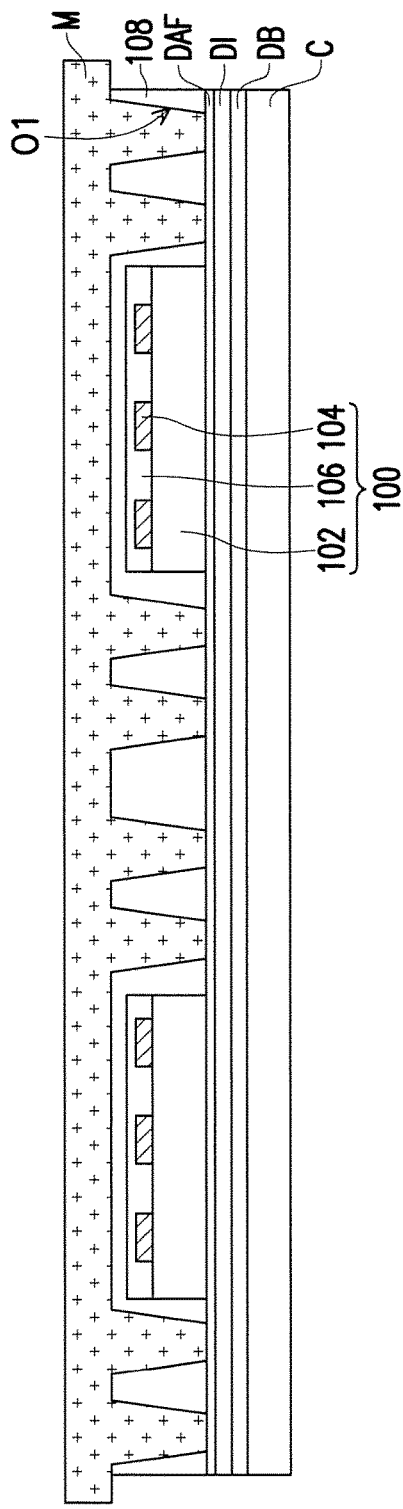
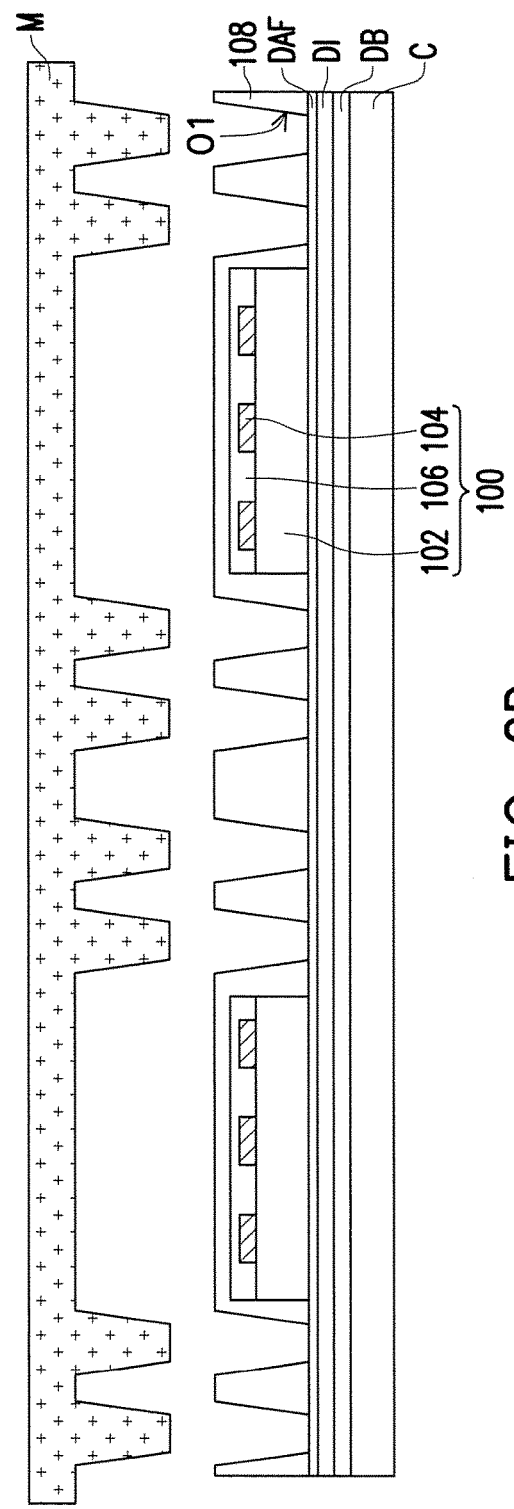
FIG. 2C
FIG. 2D

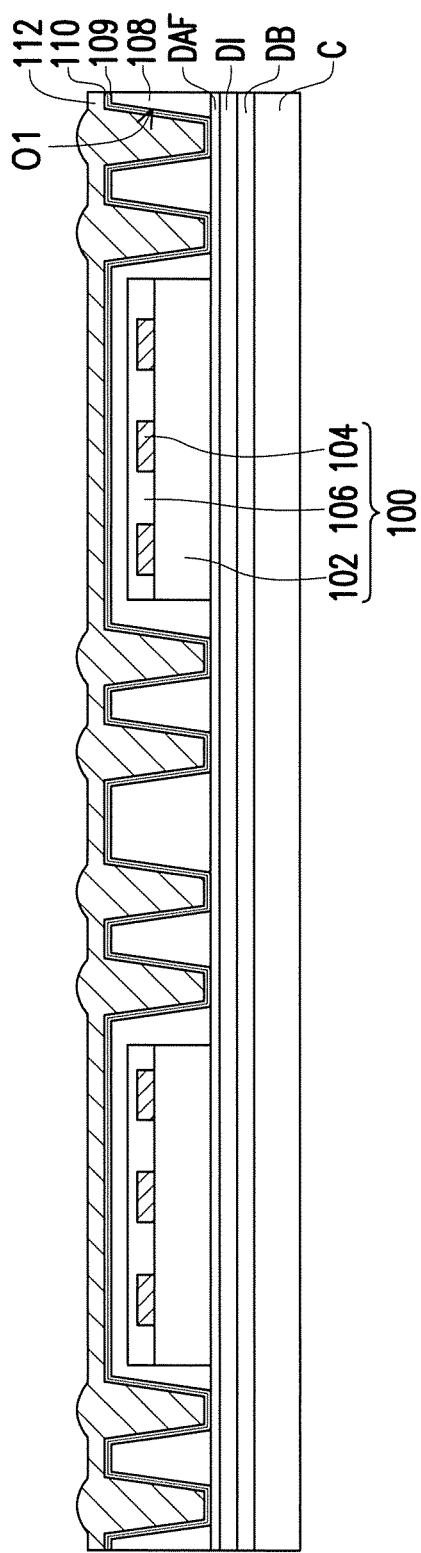
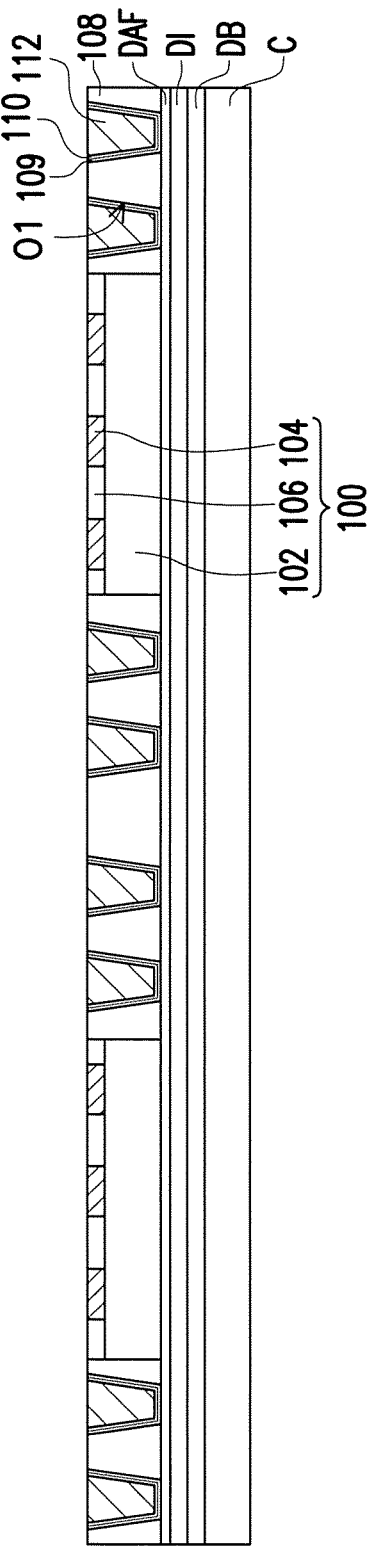
FIG. 2E
FIG. 2F

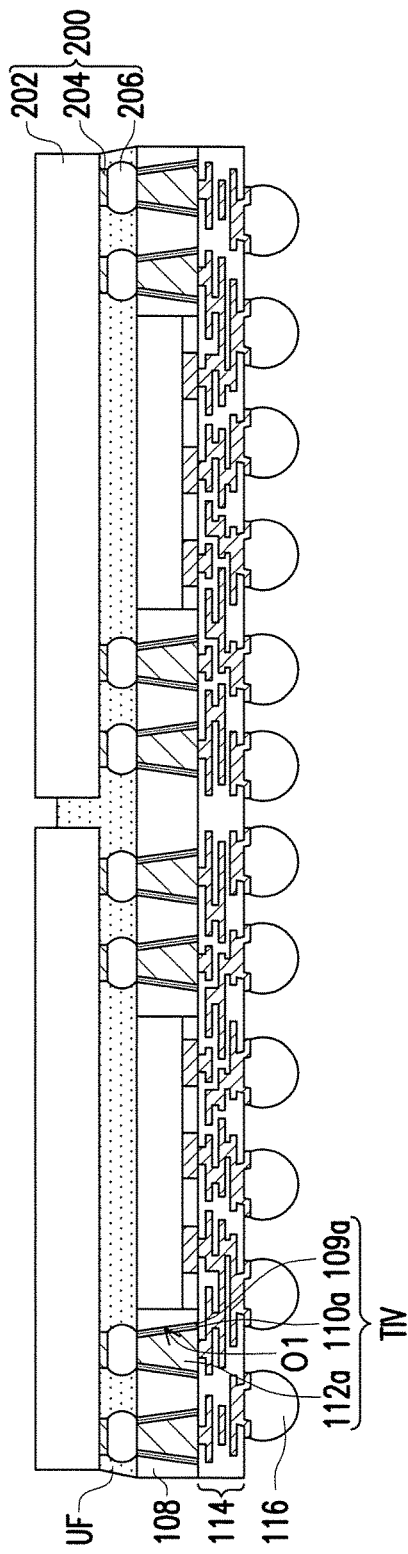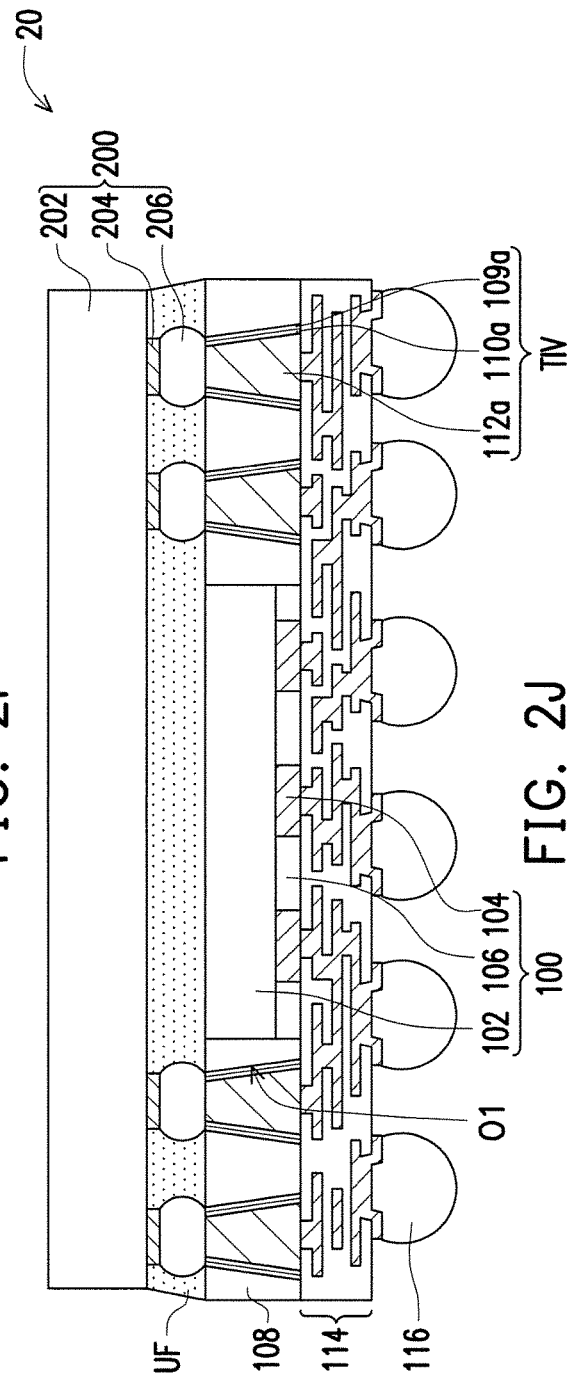
FIG. 2I
FIG. 2J

INTEGRATED FAN-OUT PACKAGES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of packages for semiconductors include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Currently, integrated fan-out packages are becoming increasingly popular for their compactness. However, there are many challenges related to integrated fan-out packages.

BRIEF DESCRIPTION OF THE DRAWINGS

FIG. 1A to FIG. 1J are cross-sectional views of a method of forming an integrated fan-out package in accordance with some embodiments.

FIG. 2A to FIG. 2J are cross-sectional views of a method of forming an integrated fan-out package in accordance with alternative embodiments.

DETAILED DESCRIPTION

Figure 1A:
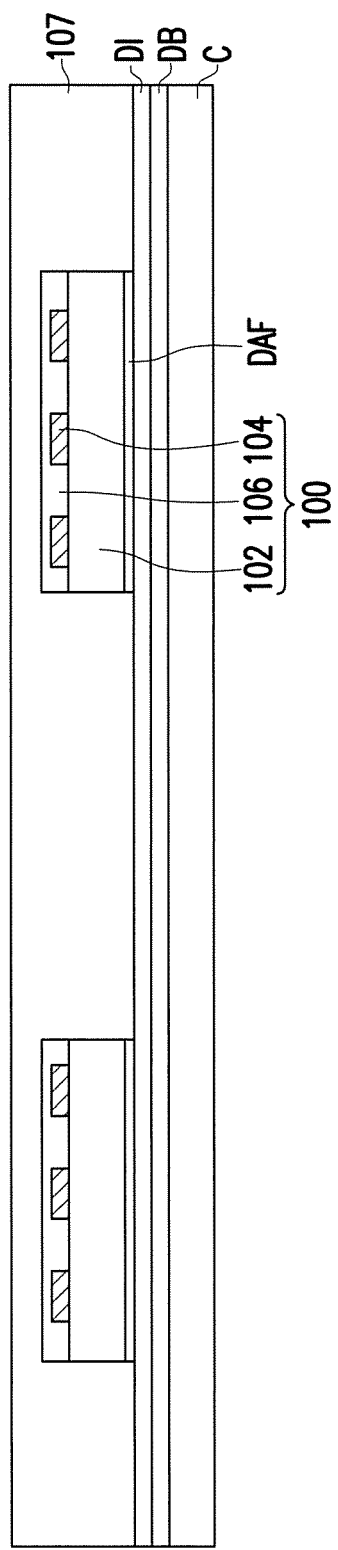

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are cross-sectional views of a method of forming an integrated fan-out package in accordance with some embodiments.

Referring to FIG. 1A, one or more first dies 100 are provided. In some embodiment, each of the first dies 100 includes a substrate 102, one or more connectors 104 and a passivation layer 106. The substrate 102 includes, for example but not limited to, bulk silicon, doped or undoped, or an active layer of a semiconductor-on-insulator (SOI) substrate. The connectors 104 are formed over and electrically connected to underlying pads or an interconnection structure (not shown) of the first dies 100. In some embodiments, the connectors 104 are formed as the top portions of the first dies 100. The connectors 104 protrude from the remaining portions or lower portions of the first dies 100. Throughout the description, the sides of the first dies 100 with the connectors 104 are referred to as front sides or first sides. The connectors 104 can be electrical connectors, dummy connectors or both. The connectors 104 may include solder bumps, gold bumps, copper pillars or the like, and are formed with a ball drop process or an electroplating process. The passivation layer 106 is formed over the first dies 100 to cover tops and sidewalls of the connectors 104 and fill gaps between the connectors 104. In some embodiments, the passivation layer 106 includes a photo-sensitive material such as polybenzoxazole (PBO), polyimide, benzocyclobutene (BCB), a combination thereof, or the like, which may be easily patterned using a lithography mask. In alternative embodiments, the passivation layer 106 includes a nitride such as silicon nitride, an oxide such as silicon oxide, phosphosilicate glass (PSG), borosilicate glass (BSG), boron-doped phosphosilicate glass (BPSG), a combination thereof, or the like.

In some embodiments, the first dies 100 are formed in a wafer stage. After the formation of the passivation layer 106, an adhesive layer or a blanket die attach film is formed over the back sides or second sides of the first dies 100. A singulation process is then performed along the scribe regions, using a saw blade or laser cutting tool, to separate the first dies 100 from each other, and thus, the first dies 100 with die attach films DAF on the back sides thereof are provided.

Continue referring to FIG. 1A, one or more first dies 100 are placed on a carrier C. In some embodiments, the die attach films DAF are formed on the back sides or second sides of the first dies 100 before the first dies 100 are picked and placed on the carrier C. The carrier C is provided with a debonding layer DB and a dielectric layer DI formed thereon. The carrier C may be a blank glass carrier, a blank ceramic carrier or the like. The debonding layer DB may be formed of an adhesive such as an ultraviolet (UV) glue, a light-to-heat conversion (LTHC) glue or the like, although other types of adhesives may be used. In some embodiments, the debonding layer DB is decomposable under the heat of light to thereby release the carrier C from the structure formed thereon. The dielectric layer DI is formed over the debonding layer DB. In some embodiments, the dielectric layer DI is a polymer layer. The polymer includes, for example, polybenzoxazole (PBO), polyimide, benzocyclobutene (BCB), Ajinomoto Buildup Film (ABF), Solder Resist film (SR) or the like. The dielectric layer DI is formed by a suitable fabrication technique such as spin-coating, lamination, deposition or the like. In some embodiments, each of the first dies 100 is attached to the dielectric layer DI with a die attach film DAF disposed therebetween. In alternative embodiments, the operation of forming the dielectric layer DI can be omitted, and each of the first dies 100 is attached to the debonding layer DB with a die attach film DAF therebetween.

Thereafter, a pre-molding layer 107 is formed over the first dies 100. Specifically, the pre-molding layer 107 is formed on a top surface of the dielectric layer DI and encapsulates the tops and sidewalls of the first dies 100. In some embodiments, the pre-molding layer 107 includes a molding compound, a molding underfill, a resin or the like, such as epoxy. The pre-molding layer 107 may be formed by a suitable fabrication technique such as spin-coating, lamination, deposition or the like. In some embodiments, the pre-molding layer 107 includes a photo-sensitive material such as polybenzoxazole (PBO), polyimide, benzocyclobutene (BCB), a combination thereof, or the like. In alternative embodiments, the molding layer 108 includes a nitride such as silicon nitride, an oxide such as silicon oxide, phosphosilicate glass (PSG), borosilicate glass (BSG), boron-doped phosphosilicate glass (BPSG), a combination thereof, or the like.

Figure 1B:
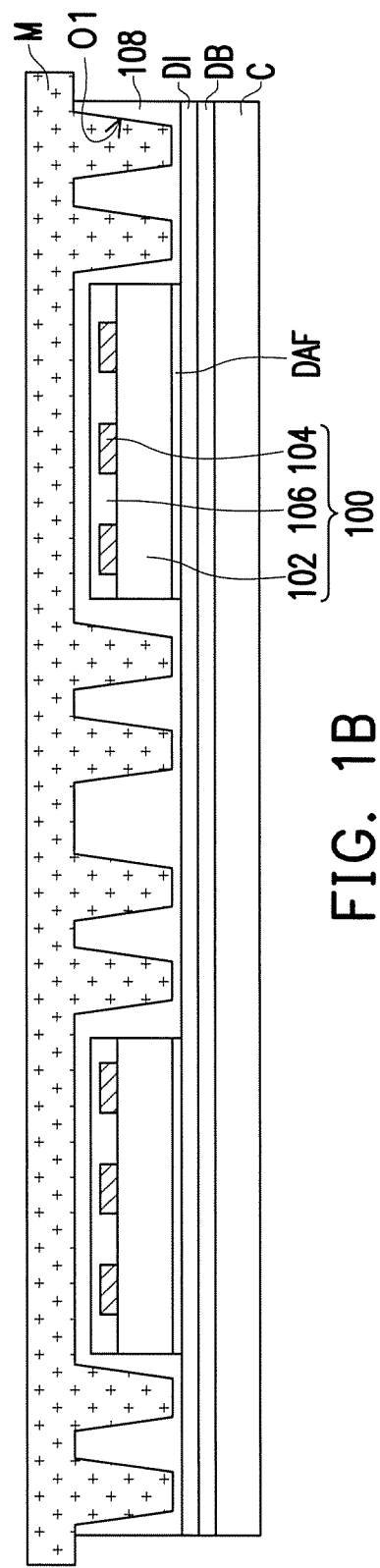
Figure 1C:
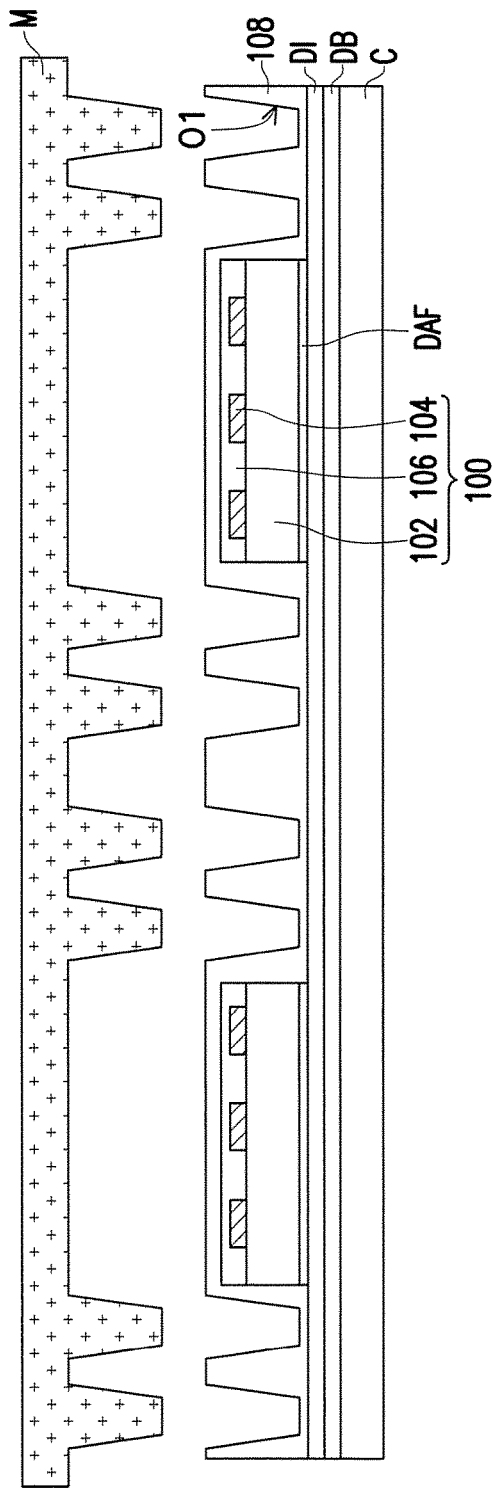

Referring to FIG. 1B and FIG. 1C, the pre-molding layer 107 is molded to form a molding layer 108 with one or more first openings O1 therein. In some embodiments, the first openings O1 do not penetrate through the molding layer 108. In some embodiments, a mold M of a molding machine is pressed against the molding layer 108 to define a plurality of first openings O1 in the molding layer 108, as shown in FIG. 1B. The mold M includes a mold chest and a plurality of mold pins protruded from a contacting surface of the mold chest. The shape of the mold pins corresponds to the shape of the subsequently formed through integrated fan-out vias (TIV). In some embodiments, the mold pins of the mold M have inclined sidewalls. For example, the cross-sectional area of each of the mold pins is gradually decreased away from the mold chest of the mold M. In alternative embodiments, the mold pins of the mold M have substantially vertical sidewalls perpendicular to the contacting surface of the mold chest. In some embodiments, the height of the mold pins is less than the height of the molding layer 108, so the formed first openings O1 do not penetrate through the molding layer 108. After the first openings O1 are formed in the molding layer 108, the mold M is lifted up, as shown in FIG. 1C. Specifically, the first openings O1 extend into the molding layer 108 from the front sides to the back sides of the first dies 100. In some embodiments, the first openings O1 have inclined sidewalls. For example, the cross-sectional area of each of the first openings O1 is gradually decreased towards the back sides or second sides of the first dies 100. In alternative embodiments, the first openings O1 have substantially vertical sidewalls perpendicular to a front surface of the molding layer 108.

In some embodiments, during the step in FIG. 1B, the mold M with the molding layer 108 are heated for a period of time, so as to semi-cure the molding layer 108. After the mold M is lifted up, as shown in FIG. 1C, the semi-cured molding layer 108 is heated for another period of time, so as to fully cure the material layer 108.

Figure 1D:
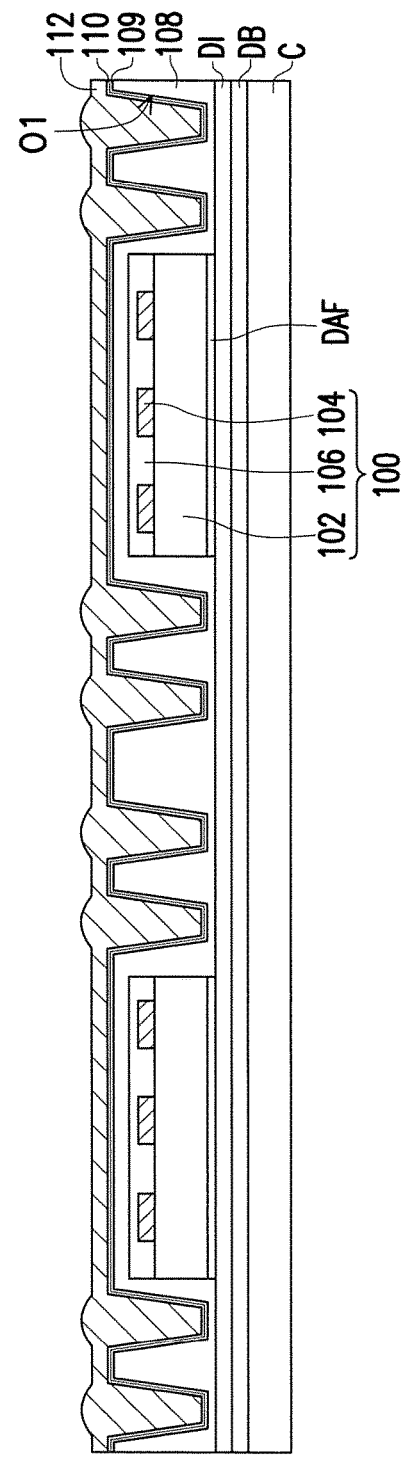

Referring to FIG. 1D, a glue material layer 109, a seed material layer 110 and a metal material layer 112 are formed on the surfaces of the first openings O1. Specifically, the glue material layer 109, the seed material layer 110 and the metal material layer 112 are sequentially formed over the molding layer 108 and cover the entire surfaces of the first openings O1. In some embodiments, the glue material layer 109 helps to adhere the molding layer 108 to the subsequently formed seed material layer 110. The glue material layer 109 may include a titanium-based or tantalum-based material, such as titanium, titanium nitride, tantalum, tantalum nitride, a combination thereof, or the like, and may be formed through a process such as PVD, CVD, sputtering or the like, although other methods and materials may alternatively be used. The seed material layer 110 may be deposited by PVD, CVD, sputtering or the like, although other methods may alternatively be used. The seed material layer 110 may include a copper-based material such as copper, a titanium copper alloy or the like, although other materials (e.g., nickel, gold) may alternatively be used. The metal material layer 112 may include a copper-based material such as copper, a copper-based alloy or the like, although another suitable material such as nickel, titanium, aluminum or the like, may alternatively be utilized. The metal material layer 112 may be formed by electroplating copper onto the seed material layer 110, although any suitable alternative process for forming the metal material layer 112 may alternatively be utilized. In some embodiments, the glue material layer 109, the seed material layer 110 and the metal material layer 112 together completely fill up the first openings O1.

In some embodiments, the glue material layer 109 is in physical contact with the molding layer 108, as shown in FIG. 1D. In alternative embodiments, the operation of forming the glue material layer 109 can be omitted, and the seed material layer 110 is formed directly on the molding layer 108.

Figure 1E:
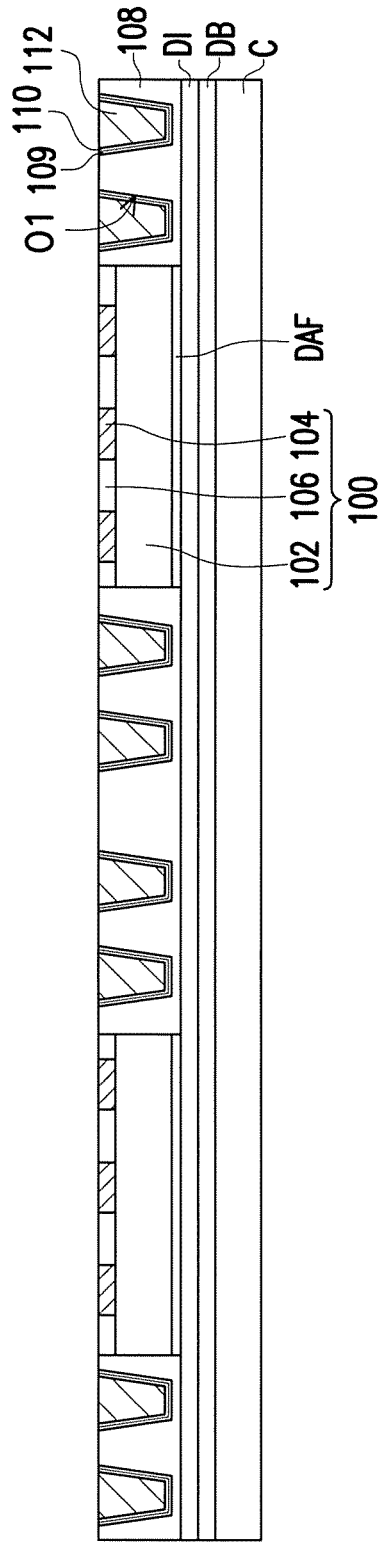

Referring to FIG. 1E, the molding layer 108 is ground from the front sides or first sides of the first dies 100 until the connectors 104 of the first dies 100 are exposed. In some embodiments, a grinding process is performed to remove a portion of the molding layer 108 and a portion of the passivation layer 106. During the grinding process, portions of the glue material layer 109, the seed material layer 110 and the metal material layer 112 outside of the first openings O1 are simultaneously removed, so as to form the through integrated fan-out vias TIV.

Figure 1F:
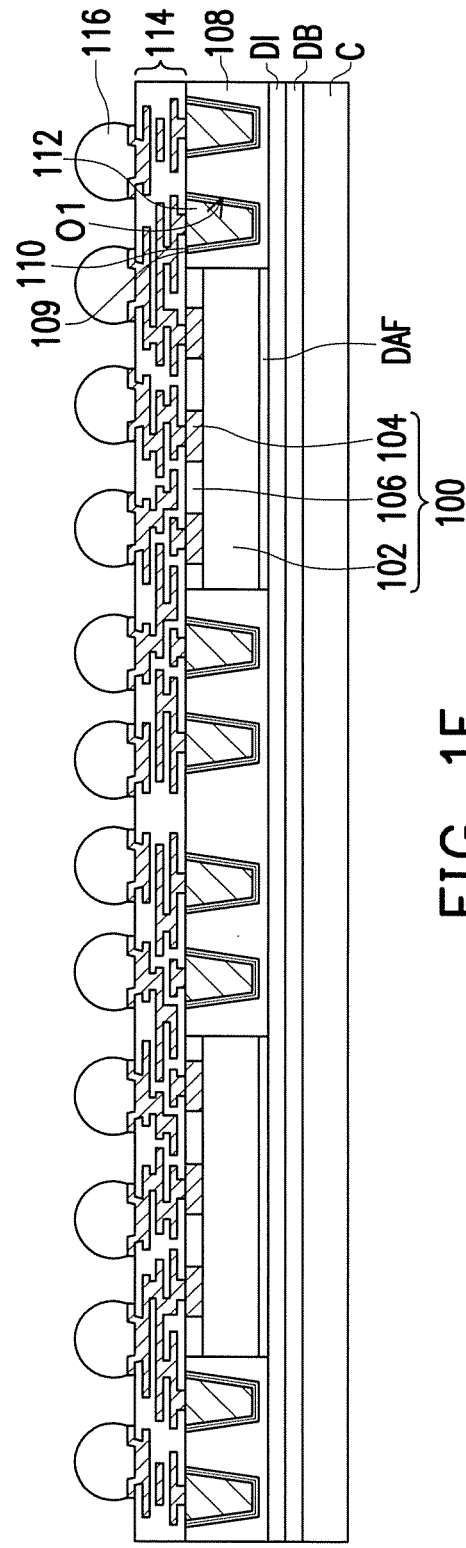

Referring to FIG. 1F, a redistribution layer structure 114 is formed over the first sides of the first dies 100. In some embodiments, the redistribution layer structure 114 is electrically connected to the connectors 104 of the first dies 100 and the metal material layer 112 in the first openings O1. The redistribution layer structure 114 may also be referred to as a "front-side redistribution layer structure" throughout the specification. In some embodiments, the redistribution layer structure 114 includes a plurality of polymer layers and a plurality of redistribution layers stacked alternately. The number of the polymer layers or the redistribution layers is not limited by the disclosure. In some embodiments, the topmost redistribution layer is also called an under-ball metallurgy (UBM) layer for ball mount. In some embodiments, each of the polymer layers includes polybenzoxazole (PBO), polyimide, benzocyclobutene (BCB), a combination thereof, or the like. In some embodiments, each of the redistribution layers includes copper, nickel, titanium, a combination thereof, or the like, and is formed by an electroplating process.

Thereafter, balls or bumps 116 are formed over and electrically connected to the redistribution layer structure 114. In some embodiments, the bumps 116 are made of a conductive material with low resistivity, such as Sn, Pb, Ag, Cu, Ni, Bi or an alloy thereof, and are formed by a suitable process such as evaporation, plating, ball drop, or screen printing.

Referring to FIG. 1G, the carrier C is debonded. In some embodiments, the carrier C with the first dies 100, the molding layer 108, the redistribution layer structure 114 and the bumps 116 is turned over, the debonding layer DB is decomposed under heat of light, and the carrier C is then released from the back sides or second sides of the first dies 100.

Referring to FIG. 1H and FIG. 1I, second dies 200 are electrically connected to or bonded to the first dies 100 from the back sides or second sides of the first dies 100. In some embodiments, each of the second dies 200 includes a memory device or a suitable semiconductor device. As shown in FIG. 1H, a patterning process is performed to the molding layer 108 from the back sides or second sides of the first dies 100, so as to form second openings O2 corresponding to the first openings O1. In some embodiments, portions of the dielectric layer DI, the glue material layer 109 and the seed material layer 110 are simultaneously removed during the patterning process. Specifically, the second openings O2 penetrate through the dielectric layer DI, the molding layer 108, the glue material layer 109 and the seed material layer 110 and expose the metal material layer 112 in the first openings O1. In some embodiments, the patterning process includes a laser drilling process. In some embodiments, after the laser drilling process, a treatment is performed from the back sides or second sides of the first dies 100, so the residues caused by the laser drilling process and/or the exposed glue material layer 109 or seed material layer 110 (if not removed by the laser drilling process) are removed to expose the metal material layer 112 in the first openings O1. In some embodiments, the treatment includes a plasma cleaning process, a dry etching process or the like.

In some embodiments, the second openings O2 have inclined sidewalls. For example, the cross-sectional area of each of the second openings O2 is gradually decreased towards the back sides or second sides of the first dies 100. In alternative embodiments, the second openings O2 have substantially vertical sidewalls perpendicular to a back surface of the molding layer 108.

Thereafter, the second dies 200 are provided over the back sides or second sides of the first dies 100. In some embodiments, each of the second dies 200 includes a substrate 202, a plurality of pads 204 and a plurality of bumps 206. The second dies 200 are electrically connected to or bonded to the first dies 100, from the back sides of the first dies 100, with the bumps 206 filling into the second openings O2. Specifically, the bumps 206 of the second dies 200 are aligned and filled into the second openings O2 in the dielectric layer DI and the molding layer 108, and are bonded to the through integrated fan-out vias TIV. In some embodiments, each of the through integrated fan-out vias TIV includes a glue layer 109a, a seed layer 110a and a metal layer 112a. The seed layer 110a is between the glue layer 109a and the metal layer 112a.

Thereafter, an underfill layer UF is formed to fill the space between the first dies 100 and the second dies 200 and to surround the bumps 206. In some embodiments, the underfill layer UF includes a molding compound such as epoxy, and is formed using dispensing, injecting, and/or spraying.

Referring to FIG. 1J, a singulation process is performed to separate integrated fan-out packages 10 (or called PoP packages in some embodiments) from each other. In some embodiments, the semiconductor device is singulated through the underfill layer UF, the dielectric layer DI, the molding layer 108 and the polymer layers of the redistribution structure 114, using a saw blade or laser cutting tool, to separate the individual integrated fan-out packages 10.

The above embodiments in which a laser drilling process is performed before bonding the second dies to the first dies are provided for illustration purposes, and are not construed as limiting the present disclosure. In alternative embodiments, the laser drilling process can be omitted to further simplify the process.

FIG. 2A to FIG. 2J are cross-sectional views of a method of forming an integrated fan-out package in accordance with alternative embodiments. The method of FIG. 2A to FIG. 2J is similar to the method of FIG. 1A to FIG. 1J. Is may be noted that the difference between the embodiments will be described further in detail below.

Figure 2A:
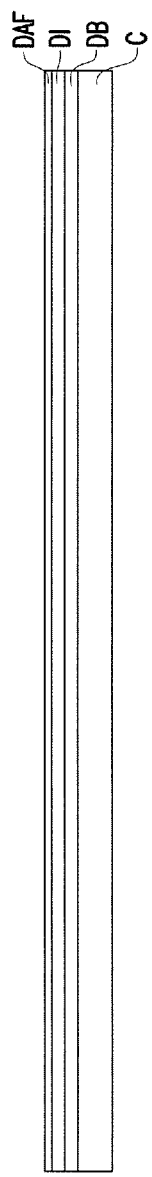

Referring to FIG. 2A, a carrier C having a die attach film DAF thereon is provided. Specifically, the carrier C is provided with a debonding layer DB, a dielectric layer DI and the die attach film DAF sequentially formed thereon. In some embodiments, the die attach film DAF is a blanket die attach film that covers the entire surface of the dielectric layer DI.

Figure 2B:
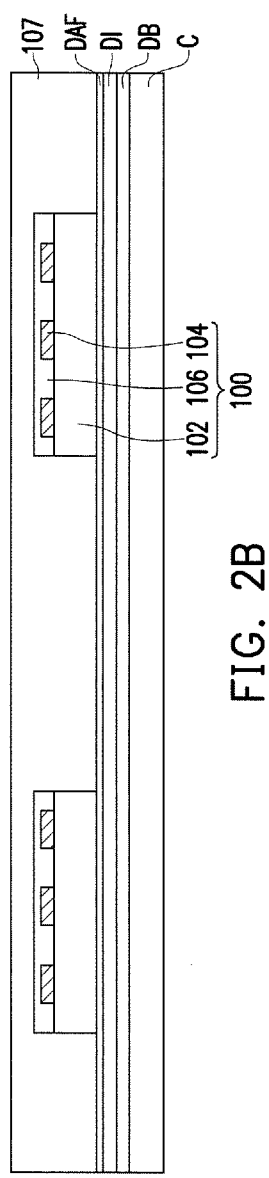

Referring to FIG. 2B, one or more first dies 100 are placed on the die attach film DAF. In some embodiments, the first dies 100 are picked and placed on the die attach film DAF over the carrier C. Thereafter, a pre-molding layer 107 is formed over the first dies 100. Specifically, the pre-molding layer 107 is formed on the surface of the die attach film DAF and encapsulates the tops and sidewalls of the first dies 100.

Referring to FIG. 2C and FIG. 2D, the pre-molding layer 107 is molded to form a molding layer 108 with one or more first openings O1 therein. In some embodiments, the first openings O1 penetrate through the molding layer 108. In some embodiments, a mold M of a molding machine is pressed against the molding layer 108 to define a plurality of first openings O1 in the molding layer 108, as shown in FIG. 2C. The mold M includes a mold chest and a plurality of mold pins protruded from the surface of the mold chest. In some embodiments, the height of the mold pins is substantially equal to or slightly greater than the height of the molding layer 108, so the formed first openings O1 penetrate through the molding layer 108 and are in physical contact with the die attach film DAF. After the first openings O1 are formed in the molding layer 108, the mold M is lifted up, as shown in FIG. 2D.

Referring to FIG. 2E, a glue material layer 109, a seed material layer 110 and a metal material layer 112 are formed on the surfaces of the first openings O1. In some embodiments, the glue material layer 109 is in physical contact with the molding layer 108, as shown in FIG. 2E. In alternative embodiments, the operation of forming the glue material layer 109 can be omitted, and the seed material layer 110 is formed directly on the molding layer 108.

Referring to FIG. 2F, the molding layer 108 is grounded from the front sides or first sides of the first dies 100 until the connectors 104 of the first dies 100 are exposed.

Figure 2G:
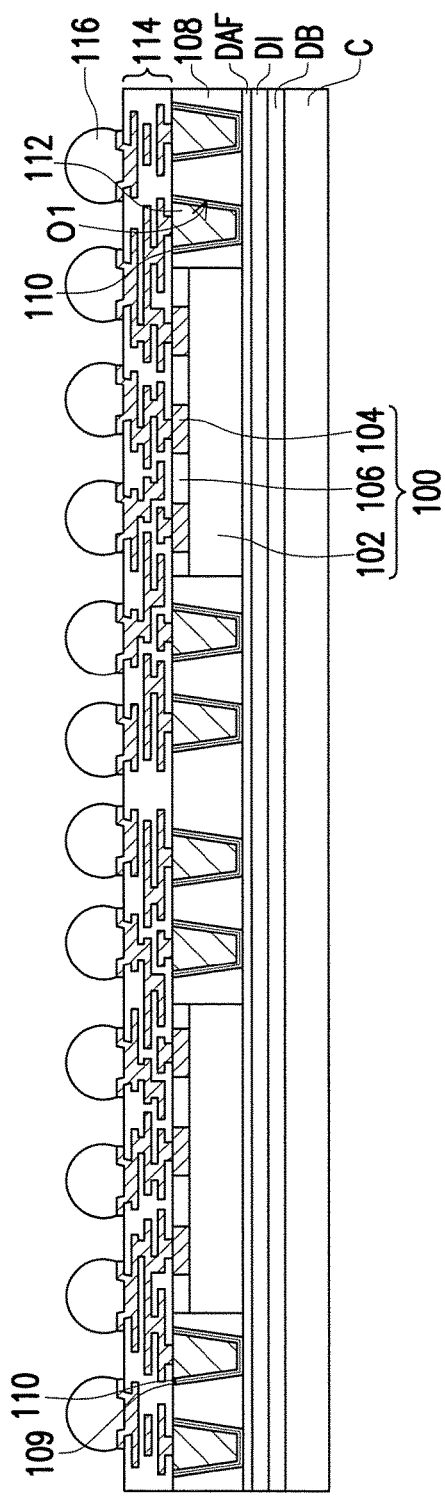

Referring to FIG. 2G, a redistribution layer structure 114 is formed over the front sides or first sides of the first dies 100. Thereafter, bumps 116 are formed over and electrically connected to the redistribution layer structure 114.

Figure 2H:
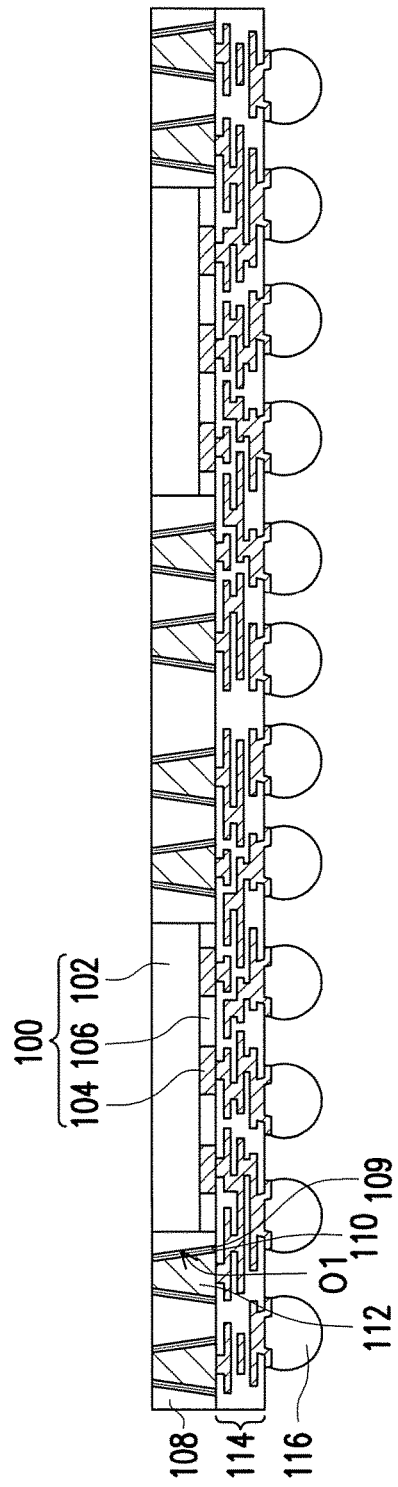

Referring to FIG. 2H, the carrier C is debonded. In some embodiments, the debonding layer DB is decomposed under heat of light, and the carrier C is then released from the back sides or second sides of the first dies 100.

Thereafter, the die attach film DAF is removed to expose the glue material layer 109. In some embodiments, the removing operation includes performing a dry etching process and a wet etching process. In some embodiments, the dielectric layer DI is simultaneously removed during the removing operation.

Afterwards, a treatment is performed from the back sides or second sides of the first dies 100, so the exposed glue material layer 109 and seed material layer 110 are removed to expose the metal material layer 112 in the first openings O1. In some embodiments, the treatment includes a plasma cleaning process, a dry etching process or the like.

Referring to FIG. 2I, second dies 200 are electrically connected to or bonded to the first dies 100 from the back sides or second sides of the first dies 100. Specifically, the second dies 200 are bonded to the first dies 100, from the back sides of the first dies 100, with the bumps 206 and the through integrated fan-out vias TIV. In some embodiments, each of the through integrated fan-out vias TIV includes a glue layer 109a, a seed layer 110a and a metal layer 112a. The seed layer 110a is between the glue layer 109a and the metal layer 112a. Thereafter, an underfill layer UF is formed to fill the space between the first dies 100 and the second dies 200 and to surround the bumps 206.

Referring to FIG. 2J, a singulation process is performed to separate integrated fan-out packages 20 (or called PoP packages in some embodiments) from each other.

The structures of the integrated fan-out packages are illustrated below with reference to FIG. 1J and FIG. 2J. An integrated fan-out package 10/20 includes a first die 100, at least one through integrated fan-out via TIV and a molding layer 108. The at least one through integrated fan-out via TIV is aside the first die 100. In some embodiments, the through integrated fan-out via TIV includes a glue layer 109a, a seed layer 110a and a metal layer 112a. In alternative embodiments, the through integrated fan-out via TIV includes a seed layer 110a and a metal layer 112a. In some embodiments, the glue layer 109a includes a titanium-based or tantalum-based material, the seed layer 110a includes a copper-based material, and the metal layer 112a includes a copper-based material. The molding layer 108 encapsulates or surrounds the sidewall of the at least one through integrated fan-out via TIV and the sidewall of the first die 100. The seed layer 110a is between the metal layer 112a and the molding layer 108 and surrounds the entire sidewall of the metal layer 112a. In some embodiments, the glue layer 109a is between and in physical contact with the seed layer 110a and the molding layer 108. In alternative embodiments, the seed layer 110a is between and in physical contact with the metal layer 112a and the molding layer 108.

In some embodiments, the surface of the molding layer 108 is not flush with the surface of the at least one through integrated fan-out via TIV. In some embodiments, the molding layer 108 further covers a portion of the top surface of the at least one through integrated fan-out via TIV, as shown in FIG. 1J. From another point of view, the molding layer 108 forms a hooking structure that embraces the edge portion of the through integrated fan-out via TIV, and the optional glue layer 109a and the seed layer 110a have a turning point around the edge portion of the through integrated fan-out via TIV.

In alternative embodiments, the surface of the molding layer 108 is flush with the surface of the at least one through integrated fan-out via TIV, as shown in FIG. 2J.

The integrated fan-out package 10/20 further includes a redistribution layer structure 114 and a second die 200. The redistribution layer structure 114 is at the front side or first side of the first die 100 and is electrically connected to the first die 100. The second die 200 is at the back side or second side of the first die 100. The second die 200 includes at least one bump 206 and is electrically connected to or bonded to the first die 100 through the at least one through integrated fan-out via TIV and the at least one bump 206. In some embodiments, a portion of the at least one bump 206 is embedded by the molding layer 108. Specifically, the at least one bump 206 extends into a portion of the molding layer 108 and is electrically connected to the metal layer 112a of the at least one through integrated fan-out via TIV. In some embodiments, the cross-sectional area of the at least one through integrated fan-out via TIV is gradually reduced towards the at least one bump 206. In alternative embodiments, the cross-sectional area of the at least one through integrated fan-out via TIV is substantially unchanged.

The integrated fan-out package 10/20 further includes an underfill layer UF between the first die 100 and the second die 200 and around the at least one bump 206. In some embodiments, a die attach film DAF is between the first die 100 and the underfill layer UF, as shown in FIG. 1J. A dielectric layer DI may be optionally disposed between the die attach film DAF and the underfill layer UF.

In alternative embodiments, a die attach film is not present between the first die 100 and the underfill layer UF, as shown in FIG. 2J. Specifically, the underfill layer UF is in physical contact with the molding layer 108 without a dielectric layer therebetween.

In view of the above, the TIV patterns (e.g., the patterns each including a glue material layer 109, a seed material layer 110 and a metal material layer 112 as shown in FIG. 1E) of the disclosure are defined by molding a molding layer, with a mold chest having TIV pattern pins, to form TIV openings therein, and then forming a seed layer and plating a metal layer in the TIV openings. By such sequence, some conventional operations such as the operation of forming a dry resist film strip before plating a metal layer and the operation of removing the dry resist film strip and the underlying seed layer after plating the metal layer can be omitted. In other words, a dry resist film is not required during the formation of the TIV patterns of the disclosure. Therefore, the process of defining TIV patterns is significantly simplified, and the production cost is greatly reduced.

In accordance with some embodiments of the present disclosure, an integrated fan-out package includes a first die, at least one through integrated fan-out via and a molding layer. The at least one through integrated fan-out via is aside the first die and includes a seed layer and a metal layer. The molding layer encapsulates the at least one through integrated fan-out via and the first die. Besides, the seed layer surrounds a sidewall of the metal layer and is between the metal layer and the molding layer.

In accordance with alternative embodiments of the present disclosure, a method of forming an integrated fan-out package includes the following operations. A first die is placed on a carrier. A molding layer is formed over the first die, wherein at least one first opening is formed in the molding layer and the first opening does not penetrate through the molding layer. A seed material layer and a metal material layer are formed on a surface of the first opening.

In accordance with yet alternative embodiments of the present disclosure, a method of forming an integrated fan-out package includes the following operations. A carrier having a die attach film thereon is provided. A first die is placed on the die attach film. A molding layer is formed over the first die, wherein at least one first opening is formed in the molding layer and the first opening penetrates through the molding layer and is in physical contact with the die attach film. A seed material layer and a metal material layer are formed on a surface of the first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
    a first die;
    at least one through integrated fan-out via outside a peripheral edge of the first die and comprising a seed layer and a metal layer; and
    a molding layer contacting the at least one through integrated fan-out via and the first die,
    wherein the seed layer surrounds a sidewall of the metal layer and is between the metal layer and the molding layer.

2. The integrated fan-out package of claim 1, wherein the at least one through integrated fan-out via further comprises a glue layer between the seed layer and the molding layer.

3. The integrated fan-out package of claim 2, wherein the glue layer comprises a titanium-based or tantalum-based material and the seed layer comprises a copper-based material.

4. The integrated fan-out package of claim 1, wherein the molding layer further covers a portion of a surface of the at least one through integrated fan-out via.

5. The integrated fan-out package of claim 1, further comprising:
    a redistribution layer structure at a first side of the first die and electrically connected to the first die; and
    a second die at a second side of the first die opposite to the first side, wherein the second die comprises at least one bump and is electrically connected to the first die through the at least one through integrated fan-out via and the at least one bump.

6. The integrated fan-out package of claim 5, wherein a portion of the at least one bump is embedded by the molding layer.

7. The integrated fan-out package of claim 5, further comprising an underfill layer between the first die and the second die and around the at least one bump, wherein a die attach film is between the first die and the underfill layer.

8. The integrated fan-out package of claim 5, further comprising an underfill layer between the first die and the second die and around the at least one bump, wherein a die attach film is not present between the first die and the underfill layer.

9. The integrated fan-out package of claim 8, wherein the underfill layer is in physical contact with the molding layer.

10. A method of forming an integrated fan-out package, comprising:
    placing a first die on a carrier;
    forming a molding layer over the first die, wherein at least one first opening is formed in the molding layer and outside a peripheral edge of the first die, and the first opening does not expose the carrier; and
    forming a seed material layer and a metal material layer on a surface of the first opening.

11. The method of claim 10, wherein forming the molding layer comprises:
    forming a pre-molding layer over the first die;
    molding the pre-molding layer to form the molding layer with the at least one first opening therein.

12. The method of claim 10, further comprising, after forming the seed material layer and the metal material layer,
    forming a redistribution layer structure over a first side of the first die;
    debonding the carrier; and
    bonding a second die to the first die from a second side of the first die.

13. The method of claim 12, further comprising, after forming the seed material layer and the metal material layer and before forming the redistribution layer structure, grinding the molding layer from the first side of the first die until at least one connector of the first die is exposed.

14. The method of claim 12, further comprising, after debonding the carrier and before bonding the second die to the first die, performing a patterning process to the molding layer from the second side of the first die, so as to form a second opening corresponding to the first opening, wherein the patterning process comprises a laser drilling process.

15. The method of claim 10, further comprising forming a glue material layer on the surface of the first opening before forming the seed material layer and the metal material layer.

16. The method of claim 10, wherein a die attach film is formed on the second side of the first die before placing the first die on the carrier.

17. A method of forming an integrated fan-out package, comprising:
    providing a carrier having a die attach film thereon;
    placing a first die on the die attach film;
    forming a molding layer over the first die, wherein at least one first opening is formed in the molding layer, and the first opening penetrates through the molding layer and is in physical contact with the die attach film; and
    forming a seed material layer and a metal material layer on a surface of the first opening.

18. The method of claim 17, further comprising, after forming the seed material layer and the metal material layer and before forming the redistribution layer structure, grinding the molding layer from the first side of the first die until at least one connector of the first die is exposed.

19. The method of claim 17, further comprising, after removing the die attach film and before bonding the second die to the first die, performing a treatment from a second side of the first die until the metal material layer in the first opening is exposed, wherein the treatment comprises a plasma cleaning process.

20. The method of claim 17, further comprising forming a glue material layer on the surface of the first opening before forming the seed material layer and the metal material layer.

* * * * *